United States Patent
Brozek (10) Patent No.: US 7,888,961 B1
(45) Date of Patent: Feb. 15, 2011

(54) APPARATUS AND METHOD FOR ELECTRICAL DETECTION AND LOCALIZATION OF SHORTS IN METAL INTERCONNECT LINES

(75) Inventor: Tomasz Brozek, San Jose, CA (US)

(73) Assignee: PDF Solutions, Inc., San Jose, CA (US)

( * ) Notice: Subject to any disclaimer, the term of this patent is extended or adjusted under 35 U.S.C. 154(b) by 0 days.

(21) Appl. No.: 12/564,855

(22) Filed: Sep. 22, 2009

Related U.S. Application Data (62) Division of application No. 11/622,924, filed on Jan. 12, 2007, now Pat. No. 7,592,827.

(51) Int. Cl.
*G01R 31/26* (2006.01)
*G01R 31/305* (2006.01)

(52) U.S. Cl. .................. 324/765; 324/751

(58) Field of Classification Search .......... 324/158.1, 324/500–501, 765; 438/157–158, 179, 182, 438/257, 266, 283, 286, 299, 303, 305, 574, 438/587–588, 592, 595, 652; 257/48, E21.205, 257/E21.264, E21.638
See application file for complete search history.

(56) References Cited

U.S. PATENT DOCUMENTS

| | | | |
|---|---|---|---|
| 5,051,690 A | | 9/1991 | Maly et al. |
| 5,552,718 A | * | 9/1996 | Bruce et al. ............. 324/765 |
| 6,268,717 B1 | | 7/2001 | Jarvis et al. |
| 6,297,644 B1 | | 10/2001 | Jarvis et al. |
| 6,348,701 B1 | * | 2/2002 | Joo et al. ............. 257/48 |
| 6,362,634 B1 | * | 3/2002 | Jarvis et al. .......... 324/719 |
| 6,452,412 B1 | | 9/2002 | Jarvis et al. |
| 6,693,446 B2 | | 2/2004 | Song et al. |
| 6,751,519 B1 | | 6/2004 | Satya et al. |
| 6,771,077 B2 | | 8/2004 | Hamamura et al. |
| 6,813,572 B2 | | 11/2004 | Satya et al. |
| 6,930,324 B2 | * | 8/2005 | Kowalski et al. ....... 257/48 |
| 6,949,765 B2 | * | 9/2005 | Song et al. ........... 257/48 |
| 7,024,642 B2 | * | 4/2006 | Hess et al. ........... 716/4 |
| 7,067,335 B2 | | 6/2006 | Weiner et al. |

(Continued)

OTHER PUBLICATIONS

Accelerated Analysis, "High Energy Passive Voltage Contrast," http://www.acceleratedanalysis.com/hepvc.html, Nov. 5, 2006.

(Continued)

*Primary Examiner*—Ha Tran T Nguyen
*Assistant Examiner*—Joshua Benitez (57) ABSTRACT

A test structure for localizing shorts in an integrated circuit and method of testing is described. A first comb structure is formed from a first busbar and a first plurality of fingers extending from the first busbar. A second comb structure formed from a second busbar and a second plurality of fingers extending from the second busbar. The second plurality of fingers is interleaved with the first plurality of fingers. A plurality of pass gates is connected between the first plurality of fingers and the first busbar. A pass gate terminal is electrically connected to the gate electrode of each of the plurality of pass gates. When the pass gates are turned OFF thereby disconnecting the first busbar from the first plurality of fingers, voltage contrast imaging can be used to identify which of the first fingers is adjacent the short.

6 Claims, 9 Drawing Sheets

U.S. PATENT DOCUMENTS

| | | | |
|---|---|---|---|
| 7,187,179 B1 * | 3/2007 | Scaman et al. | 324/512 |
| 7,217,579 B2 * | 5/2007 | Ben-Porath et al. | 438/11 |
| 7,348,594 B2 * | 3/2008 | Ciplickas et al. | 257/48 |
| 7,394,261 B2 * | 7/2008 | Park et al. | 324/537 |
| 7,474,107 B2 | 1/2009 | Patterson et al. | |
| 7,592,827 B1 * | 9/2009 | Brozek | 324/765 |
| 7,667,477 B2 * | 2/2010 | Nagata | 324/763 |
| 7,689,948 B1 * | 3/2010 | White et al. | 716/4 |
| 7,707,528 B1 * | 4/2010 | White et al. | 716/5 |
| 7,725,845 B1 * | 5/2010 | White et al. | 716/2 |
| 7,749,778 B2 * | 7/2010 | Chanda et al. | 438/17 |
| 7,772,590 B2 * | 8/2010 | Kuan | 257/48 |
| 2003/0197523 A1 | 10/2003 | Hamamura et al. | |
| 2004/0207414 A1 | 10/2004 | Verma et al. | |
| 2005/0024077 A1 | 2/2005 | Huang et al. | |
| 2005/0218791 A1 | 10/2005 | Kawase | |
| 2007/0210306 A1 * | 9/2007 | Molinelli Acocella et al. | 257/48 |
| 2007/0296444 A1 | 12/2007 | Zhu et al. | |
| 2009/0002012 A1 | 1/2009 | Doong et al. | |

OTHER PUBLICATIONS

Patterson et al., "Detecting resistive shorts and opens using voltage contrast inspection," Defect/Yield Analysis and Metrology, MICRO: Lead News, MICRO magazine.com, http://www.micromagazine.com/grabber.php3?URL=http:// www.micromagazine.com, Nov. 5, 2006.

Lee et al., "Critical area optimizations improve IC yields," EETIMES Online, EETimes.com, http://www.eetimes.com/showArticle.jhtml?articleID=175802288, Jan. 9, 2006.

* cited by examiner

APPARATUS AND METHOD FOR ELECTRICAL DETECTION AND LOCALIZATION OF SHORTS IN METAL INTERCONNECT LINES

REFERENCE TO RELATED APPLICATIONS

This application is a Divisional Application from, and claims the benefit and priority to, the co-pending, commonly-owned U.S. Patent Application with, application Ser. No. 11/622,924, filed on Jan. 12, 2007, by Brozek et al., titled "APPARATUS AND METHOD FOR ELECTRICAL DETECTION AND LOCALIZATION OF SHORTS IN METAL INTERCONNECT LINES," and is incorporated herein by reference in their entirety.

BACKGROUND

Yield analysis is the science and art of predicting and reducing the failure rate of electronic semiconductor devices. Semiconductor devices can fail for many reasons. Identifying the causes of failures is an important initial step in modifying manufacturing process steps to reduce the number of failures to an acceptable level. Many failures can be traced to defects in metallization and/or dielectric layers leading to electrical shorts or opens. An electrical short is an electrical connection between two metal lines that should be electrically isolated from one another. An electrical open is a failure of a metal line to electrically connect its two endpoints. Electrical shorts and electrical opens can be caused by such things as contaminant particles, blocked etch, residue, scratches, etc. at various stages of wafer processing.

Figure 1:
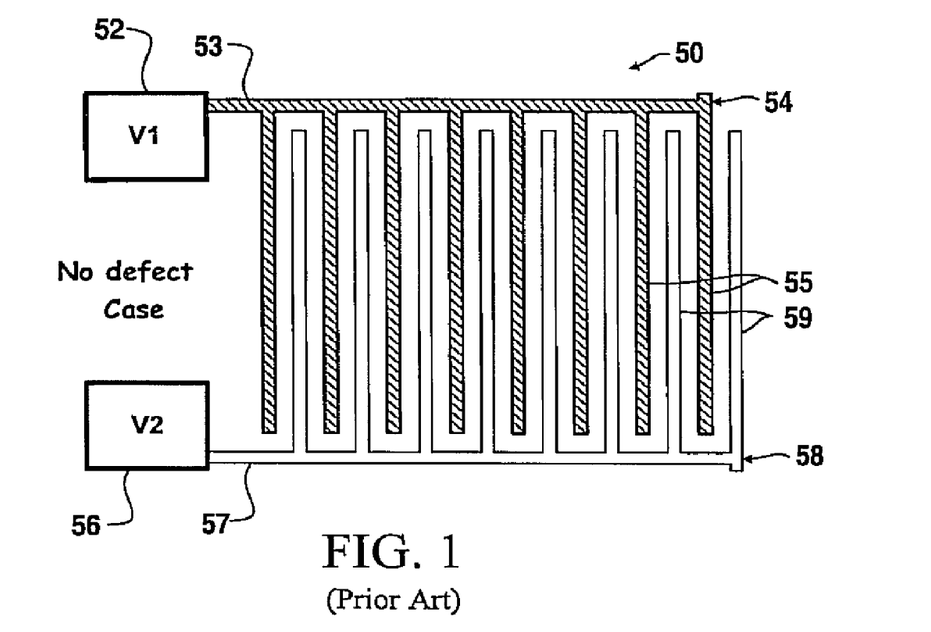
FIG. 1 shows an exemplary prior art test structure for identifying the presence of a process defect that causes a short circuit in the test structure

FIG. 1 shows an exemplary prior art test structure 50 for identifying the presence of a process defect leading to a short circuit in the structure. Test structure 50 has two comb-shaped conductors 54, 58 interleaved with one another so that a plurality of fingers 55 from first comb-shaped conductor 54 are each positioned between two fingers 59 from second comb-shaped conductor 58. Each finger 55 is permanently electrically connected to every other finger 55 by a busbar 53 so that all fingers 55 are at the same electrical potential. Likewise, all fingers 59 are permanently electrically connected to each other by a busbar 57. Cross-hatching of comb-shaped conductor 54 represents that comb-shaped conductor 54 can be held at a different electrical potential than comb-shaped conductor 58. Test structure 50 can be manufactured on a substrate, such as a silicon wafer, in a manner consistent with a proposed device to be produced. Therefore a failure rate per unit of critical area will be consistent with an actual electronic device. The purpose of the test structure is to detect defects leading to electrical shorts. A different test structure (not shown) may be used to detect defects leading to electrical opens. Test structure 50 is depicts an exemplary test structure for the purpose of illustration only, and is therefore not to scale. In order to calculate a failure rate corresponding to the critical area of the test structure, an actual test structure may be designed to fill an area that is large enough to capture a defect sometimes but not always. A test structure that is too large may be overly sensitive and therefore nearly always be defective, whereas a test structure that is too small may only rarely capture a defect so that the defect can be identified.

The critical area of a device or a test structure is a well-known concept. The critical area can be calculated mathematically from the geometry of the device using the formula $A=\int A(X)f(x)dx$, where $A(x)$ is the critical area for particle size having the diameter x, $f(x)$ is the probability that a particle of diameter x will occur, and A is the total critical area. For a short circuit, for example, $A(x)$ is the area over which the center of a particle of diameter x must fall where the particle can touch two adjacent conductors and cause a short. The product of $A(x)$ and $f(x)$ is integrated to determine a total critical area A.

Figure 2:
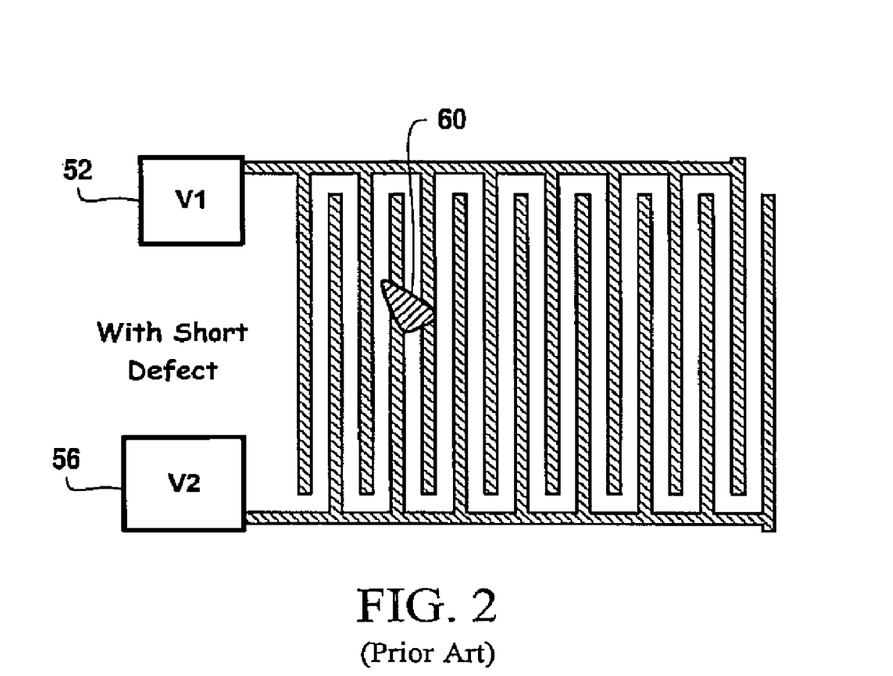
FIG. 2 shows the test structure of FIG. 1 with a defect causing a short.

The test structure, like all metallization layers in semiconductor device, may be built in stages. Any suitable process may be used to produce the test structure, such as a damascene or a subtractive process. At any point during process, a defect can occur. For example, a contaminating particle may become embedded in the metallization layer, the etching step may fail to remove a layer of metal, or a scratch can occur in the photomask that determines areas of exposure of the photoresist, causing an incorrect etching. In any case, if a defect occurs that results in a short, the presence of the defect is easily determined by testing for electrical continuity. Electrical continuity can be tested by applying a voltage differential across first and second electrodes 52, 56 and testing for the flow of current. FIG. 2 shows test structure 50 of FIG. 1 having an electricity conducting particle or other defect 60 touching both comb-shaped conductors. As a result of defect 60, the current will flow from the first electrode, through defect 60 causing the short, and then to second electrode 56. If no defect exists, then first and second electrodes will be electrically isolated from one another as in FIG. 1 and current will not flow.

The failure rate of the test structure can be determined by producing a number of test structures and electrically testing each one for electrical continuity. This failure rate can be translated into a failure rate per unit of critical area, also referred to as the electrical defect density. The percentage of failing test structures will be one component in determining the overall relation between critical area, electrical defect density, and yield. Once this relation is determined for a test structure, then by substituting the critical area of a real device for the critical area of the test structure, an accurate prediction can be made as to the yield of a real electronic device. Although such a yield prediction is an important step in identifying the expected cost of production of a device, it provides no information on the primary causes of failures, and what process modifications might be made to reduce the failure rate and thus improve the yield. In order to identify the cause of the defect, it is necessary to view the defect, e.g., using a scanning electron microscope and other known operations. Failure analysis techniques, for example, focused ion beam (FIB) milling may be used to cross-section the area of the defect if the defect is not directly visible. Finally, in order to view the defect, it must first be localized. The term, "localize" means to reduce potential locations of the defect thereby minimizing the time and expense required to identify it. For example, if half the area of test structure 50 can be eliminated as potential positions of the defect, then the defect can be said to have been localized to the area of the remaining half.

Although the presence of an electrical defect is easily determined using electrical testing as described above with reference to FIGS. 1 and 2, its location is not. It should be recognized that the metallization features may be sized on the order of tens of nanometers, and the size of the test structure may be on the order of perhaps tens of square millimeters, in which case the relative surface area over which the defect can occur as compared to the size of the defect is enormous. While visualization tools are commercially available to assist process engineers to visualize and identify individual defects, even these tools can fail to identify a defect that is not visible because, for example, it is buried beneath the metallization layer.

Milling an entire test structure to find a buried defect is too slow and expensive to be feasible. Prior art techniques for identifying non-visible defects resulting in electrical shorts include the use of infra-red imaging. In this technique, the test structure is imaged using an infrared imaging device while passing electricity through the test structure in hopes that the defect will "light up" as a result of heat generated by the electrical current. This technique, however, only works when the short is electrically resistive, which is not always the case, particularly if the short is caused by errant metallization or metal particle.

In another known technique, voltage contrast visualization is used to localize electrical opens and resistive failures. In voltage contrast, an electronic device or test structure is imaged using a scanning electron microscope (SEM). Electricity is input into the electronic device or test structure thereby placing some electronic pathways at a higher voltage potential than other electronic pathways. Because electrons directed at the device by the SEM will respond differently depending on the voltage potential of the conductor, the SEM will image the conductors differently. Generally, the conductors at the lower potential will appear brighter, thus producing "voltage contrast" in the resulting image. There are various techniques for inputting energy in the form of a voltage differential, including, for example, the use of in-situ electrodes for applying the voltage differential during the electron scanning and imaging. When an electrical pathway is open, the charged portion of the line will appear brighter or darker than the uncharged portion, thereby easily identifying the location of the defect as the position where the brightness of the conductor changes. Likewise, a resistive defect can generate a voltage contrast. However, voltage contrast techniques have not heretofore been useful to localize the position of a conductive short since it places the two conductors at the same potential, as represented in FIG. 2 by cross-hatching.

A test structure or method for localizing electrical shorts is needed to reduce the time and expense required to identify the causes of electrical shorts.

SUMMARY

Broadly speaking, the present invention fills these needs by providing an apparatus and method for electrical detection and localization of shorts in metal interconnect lines It should be appreciated that the present invention can be implemented in numerous ways, including as a process, an apparatus, a system, a device, or a method. Several inventive embodiments of the present invention are described below.

In one embodiment, a test structure for localizing shorts in an integrated circuit and method of testing is provided. A first comb structure is formed from a first busbar and a first plurality of fingers extending from the first busbar. A second comb structure formed from a second busbar and a second plurality of fingers extending from the second busbar. The second plurality of fingers is interleaved with the first plurality of fingers. A plurality of pass gates is connected between the first plurality of fingers and the first busbar. A pass gate terminal is electrically connected to the gate electrode of each of the plurality of pass gates. When the pass gates are turned OFF, thereby disconnecting the first busbar from the first plurality of fingers so that each finger is electrically isolated from the others, voltage contrast imaging can be used to identify which of the first comb fingers is adjacent the short.

In another embodiment, a method for testing a test structure for an electrical short is provided. In the method a comb pair is tested for electrical continuity. The comb pair includes a first comb-shaped structure having a first busbar and a first plurality of fingers extending form the first busbar and a second comb-shaped structure having a second busbar and a second plurality of fingers extending from the second busbar. The first plurality of fingers is interleaved with the second plurality of fingers. The test for electrical continuity determines whether a short exists between the first comb-shaped structure and the second comb-shaped structure while the first plurality of fingers are electrically connected to the first busbar and the second plurality of fingers are electrically connected to the second busbar. If a short is present, then the short is localized by electrically disconnecting the first plurality of fingers from the first busbar and imaging the test structure using voltage contrast to identify which of the first plurality of fingers is at the same electric potential as the second comb-shaped structure as a result of the short.

The advantages of the present invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

In the following description, numerous specific details are set forth in order to provide a thorough understanding of the present invention. However, it will be apparent to one skilled in the art that the present invention may be practiced without some of these specific details, in other instances, well known process operations and implementation details have not been described in detail in order to avoid unnecessarily obscuring the invention.

Figure 3:
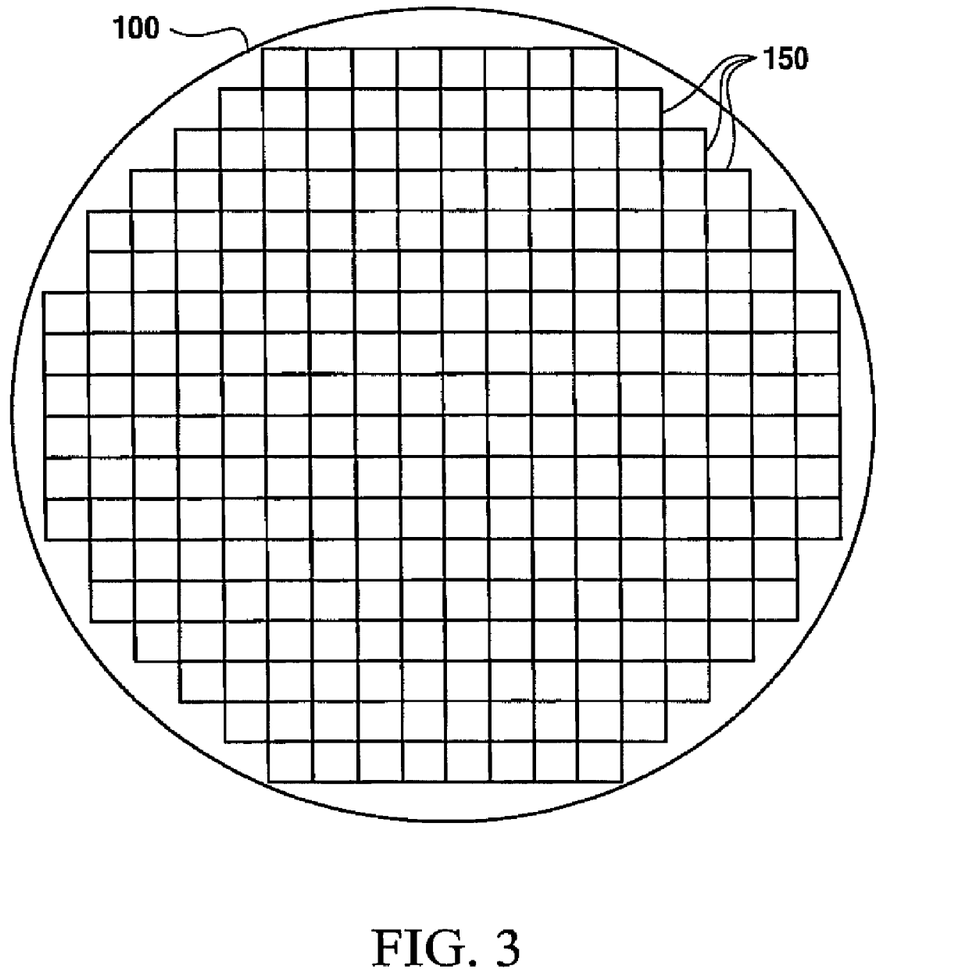
FIG. 3 shows an example of a wafer having a plurality of test structures formed thereon.

FIG. 3 shows an example of a wafer 100 having a plurality of test structures 150 formed thereon. Each test structure 150 may be identical to one another or they may vary in overall size or feature size.

Figure 4:
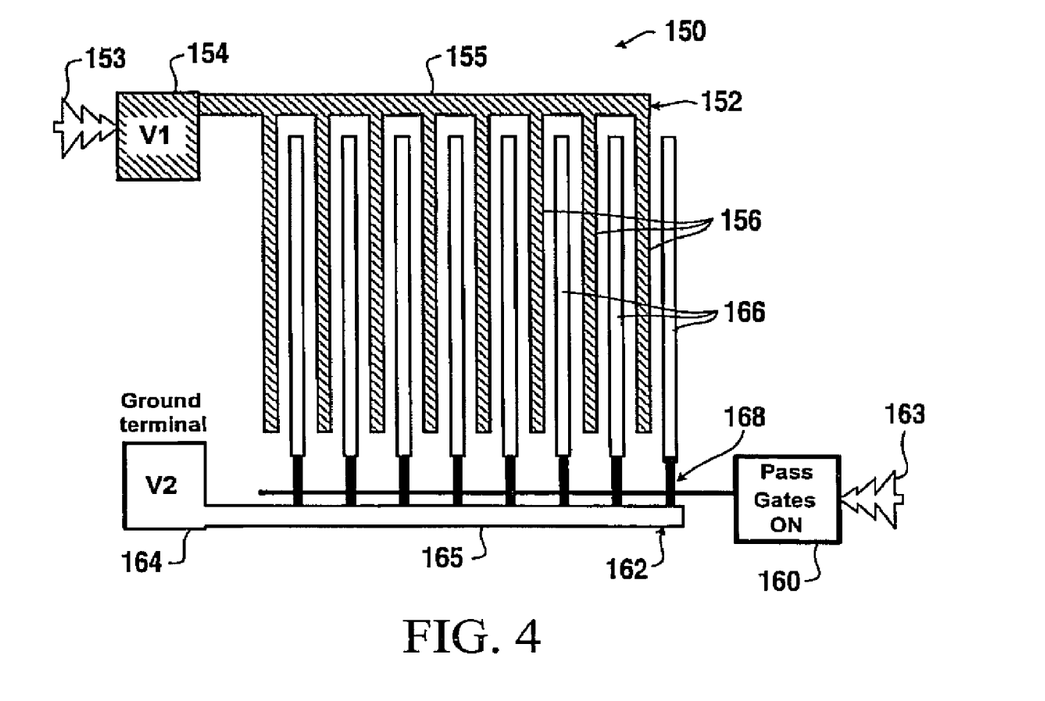
FIG. 4 shows an example of a test structure formed from two comb structures.
Figure 5:
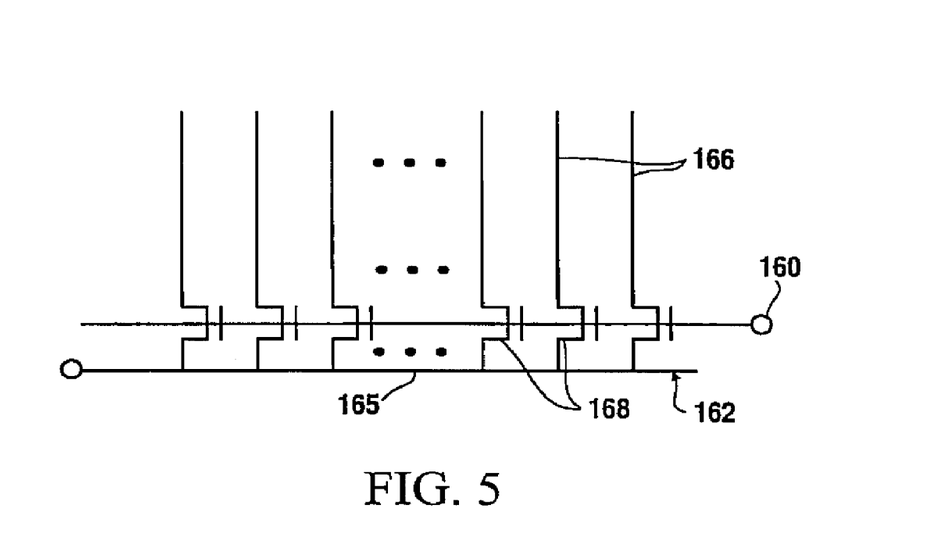
FIG. 5 shows an electrical schematic of one of the comb structures of the test structure of FIG. 4.

FIG. 4 shows an example of a test structure 150 formed from two comb structures 152, 162, each comb structure 152, 162 having multiple fingers 156, 166 interleaved with each other so that every other finger belongs to the same comb. FIG. 5 shows an electrical schematic of comb structure 162. Each finger 156 of comb 152 is connected directly to busbar 155. Each finger 166 of comb structure 162 is connected to busbar 165 by way of a pass gate 168 (also shown in FIG. 5). Each pass gate 168 comprises a transistor, and each transistor has a gate electrode that is connected to common pass gate terminal 160.

Using test structure 150, it is possible to perform an electrical continuity test to determine if there is a short between comb structure 152 and comb structure 162. For example, a voltage VI may be applied to terminal 154 and a different voltage V2 may be applied to terminal 164. In this way, a voltage is applied across terminals 154, 164 with pass gates 168 turned ON, thereby electrically connecting fingers 166 to busbar 165. If a defect exists that causes a short, then current will flow between terminals 154, 164. This current is easily detected using known current sensors. In one embodiment, pass gates 168 are turned ON by applying voltage to pass gate terminal 160. For example, a voltage Vdd may be applied to terminal 154 and pass gate terminal 160 by touching terminal 154 and pass gate terminal 160 with probes 153, 163 connected to a voltage source (not shown). Terminal 164 may be grounded (0 V) by contacting terminal 164 with a grounded probe (not shown). If there is a short, then electrical current will flow between the two comb structures.

Pass gate terminal 160 may be used to switch pass gates 168 ON or OFF. Thus, depending upon whether a voltage is applied to pass gate terminal 160, fingers 166 can be electrically connected to or disconnected from busbar 165. As shown in FIG. 5, pass gate terminal 160 is connected to the gate electrode of each of pass gates 168. In one embodiment, each pass gate 168 is a field effect transistor (YET) such as an insulated gate FET (MOSFET), although other types of devices may also be used to similar effect.

If the results of an electrical continuity test shows that a particular instance of a Lest structure contains a short, the defect causing the short can be localized using existing techniques or by voltage contrast testing. Visualization tools are commercially available that automatically identify defects at various stages of processing. These visualization tools can identify the coordinates of each visible anomaly after each stage of processing. However, it is often the case that none of the defects identified by the visualization tools can account for a specific electrical failure such as a short. In such cases, it may be necessary to use another approach to identify the defect causing the short.

Figure 6:
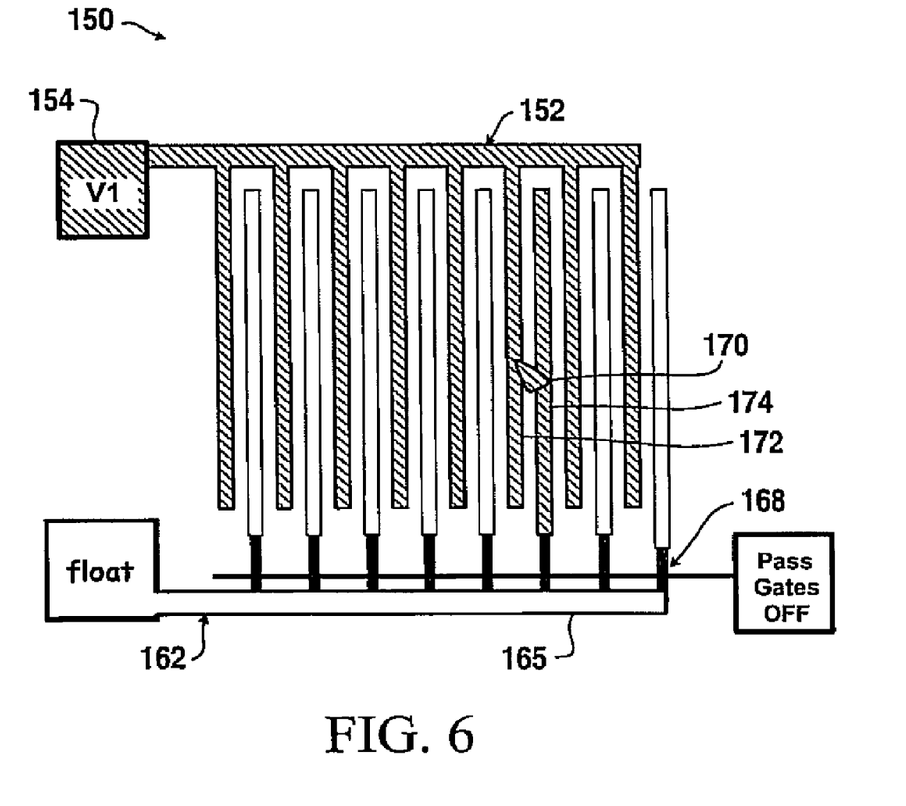
FIG. 6 shows the test structure of FIG. 4 with a defect that shorts the two comb structures under the test condition, with pass gates switched OFF.

FIG. 6 shows exemplary test structure 150 having a defect 170 that shorts the two comb structures. In this example, pass gates 168 are OFF, thereby disconnecting fingers 166 from busbar 165, which may be allowed to float. As a result, only the finger 174, which is electrically shorted to comb structure 152 by way of finger 172, will have the same electrical potential as comb structure 152. In voltage contrast, the difference in voltage is readily identifiable due to the difference in brightness between elements at different electrical potentials. As represented in FIG. 6, elements at voltage Vi are cross-hatched and elements at ground (or V2) are clear in order to mimic the appearance of actual elements viewed in a scanning electron microscope with voltage contrast. The presence of a short between finger 174 and one of its neighbors is immediately apparent. Thus, the short is localized in that its position can narrowed to only being between finger 174 and one of the immediate neighbors of finger 174.

For purposes of illustration and discussion, defect 170 is readily visible in FIG. 6. However, it should be recognized that such defects are often impossible to see without some destructive cross sectioning of the test structure. It should also be noted that test structure 150 is capable of detecting and localizing a large defect that impacts multiple adjacent fingers as well as multiple shorts when the multiple defects causing the shorts are present between different finger pairs. In these instances, additional fingers 166 may "light up," indicating that they are also at the same voltage potential as comb structure 152, and that additional shorts are therefore present in the structure. If the shorts are all adjacent one another, then this could indicate a single large defect.

Figure 7:
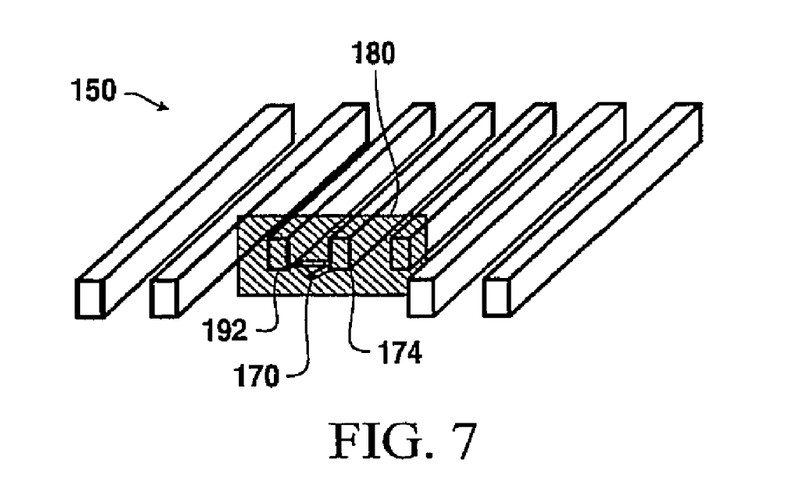
FIG. 7 shows a schematic representation of the exemplary cross-sectional image, which can be obtained with focused ion beam milling or other failure analysis technique of the test structure of FIG. 4.

FIG. 7 shows a schematic representation of focused ion beam milling of a test structure 150 to identify a hidden defect 170. Focused ion beam milling is a known technique for cross sectioning devices to view the internal structures thereof. Because defect 170 was localized to finger 174 and one of the two adjacent fingers, milling plane 180 need only be as wide as the distance between three adjacent fingers. By minimizing the width of milling plane 180, the milling can proceed along the length of finger 174 much faster than if the entire structure needed cross sectioning. It is possible using enhanced structures to further localize the defect, as described below with reference to FIGS. 9A through 11.

Figure 8:
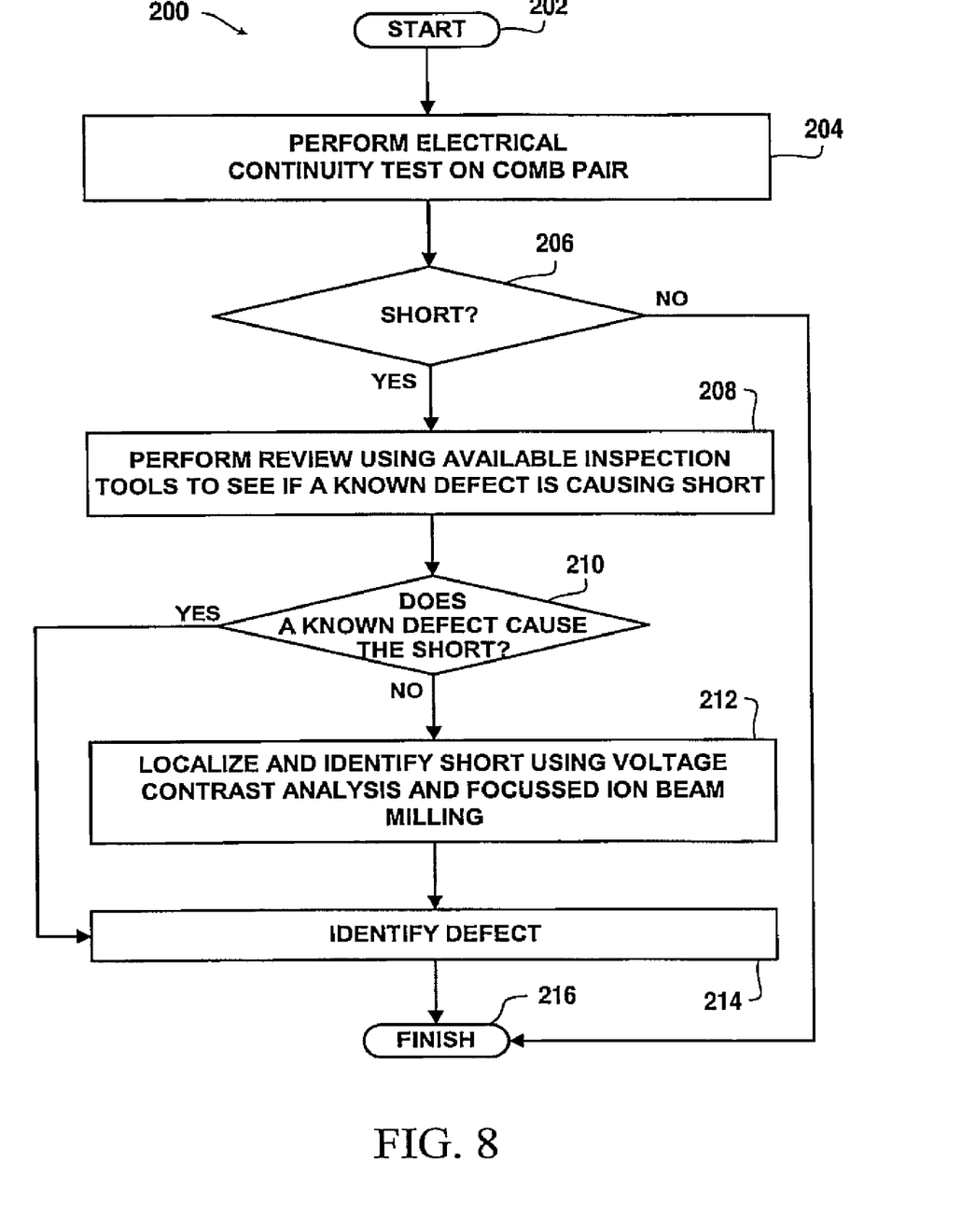
FIG. 8 shows a flowchart representing by way of an example a method for analyzing failures leading to shorts in the test structure of FIG. 4.

FIG. 8 shows a flowchart 200 representing by way of an example a method for analyzing failures leading to shorts in the test structure of FIG. 4. The procedure begins as indicated by start block 202 and proceeds to operation 204, wherein an electrical continuity test is performed on test structure 150 of FIG. 4. As explained above with reference to FIG. 4, the electrical continuity may be performed, e.g., by applying a voltage differential across terminals 154, 164, turning on pass gates 168, and measuring for current flow. The procedure then flows to operation 206 where it is determined whether there is a short. A short is indicated when there is electrical continuity between terminals 154, 164. If there is no short, then the procedure ends as indicated by the arrow leading to finish block 216. If there is a short, then the procedure flows to operation 208.

In operation 208, the known defects listed during manufacture of test structure 150 are reviewed to determine if one of the known defects cause the short. At each stage during the manufacture of test structure 150, the device may be imaged and irregularities in the image may be identified by available visualization tools. These tools may operate automatically, e.g., using machine vision, and each anomaly may be identified with specific coordinates in a list of defects. This list of defects may be reviewed and the device imaged using a scanning electron microscope at each identified coordinate to determine if a visible defect exists that explains the short.

After reviewing the list of defects, the procedure flows to operation 210, wherein it is determined whether it can be concluded that a known defect causes the short. If one of the known defects is identified during the review as causing a short, then the procedure flows to operation 214 wherein the defect is identified, along with the cause of the defect, e.g., a metallic particle was deposited that causes the short.

If, at operation 210, none of the known defects can be seen to cause the short, then the procedure flows to operation 212 wherein the short is localized using voltage contrast, and if necessary, focused ion beam milling to cross section the region of the defect in order to identify and categorize the cause of the defect. Voltage contrast images the test structure using a scanning electron microscope to identify voltage differentials among various pans of the device as described above with reference to FIG. 6. Once the defect is localized to a specific finger, then focused ion beam (FIB) milling may proceed to positively identify the defect and its cause in operation 214. The procedure then ends as indicated by finish block 216.

Figure 9A:
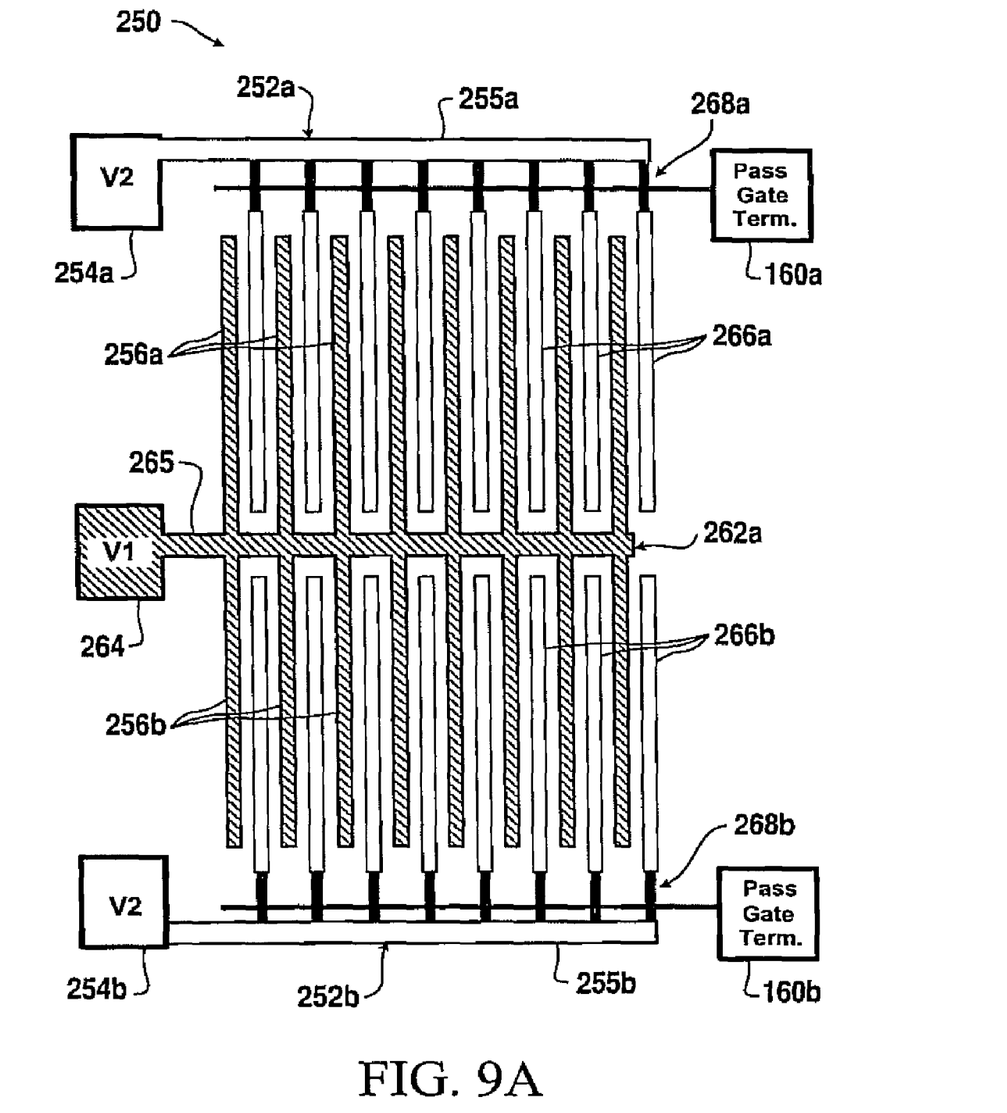
FIGS. 9A and 9B show an exemplary test structure having a double-sided comb structure.

FIG. 9A shows an exemplary test structure 250 having a double-sided comb structure 262. Double-sided comb structure 262 includes a busbar 265 dividing an area to be tested into two regions and a first plurality of fingers 266a in a first region extending in a first direction perpendicular to busbar 265 and a plurality of fingers 266b in a second region extending in a second direction perpendicular to busbar 265. Two additional comb structures 252a, 252b are in the first and second regions, respectively and are interleaved with the first and second plurality of fingers 266a, 266b, respectively. Double-sided comb structure 262 has a voltage bias terminal 264 and each comb structure 252a, 252b have a corresponding ground terminal 254a, 254b. It will be recognized that the terms, "voltage bias terminal" and "ground terminal" are used for convenience and are not intended to be limiting, the key feature being that a voltage can be applied across the respective terminals to perform a continuity and or voltage contrast test. A higher voltage may be applied to double-sided comb structure 262 or to the comb structures 252a, 252b.

A series of pass gates 268a, 268b are connected between one plurality of fingers in each region and a corresponding one of the busbars, thereby permitting that plurality of fingers to be selectively connected to the busbar. In one embodiment, pass gates 268a, 268b selectively connect fingers 266a, 266b to busbars 255a, 255b, respectively. However, it is also possible that pass gates 268a, 268b be connected between fingers 256a, 256b, respectively, and busbar 265. In another embodiment, pass gates may be provided in all four positions. Pass gates 268a, 268b, are controlled by applying a voltage at pass gate terminals 160a, 160b, respectively.

In operation, test structure 250 can be tested and defects localized in a manner similar to method described above with reference to FIGS. 4-8. Specifically, an electrical continuity test may be performed by turning ON pass gates 268a, 268b and placing a voltage differential across Vdd bias terminal 264 and ground terminals 254a, 254b, and testing for any current. If current flows from Vdd bias terminal 264 to ground terminal 254a, then a short exists between double-sided comb structure 262 and comb structure 252a. If current flows from Vdd bias terminal 264 to ground terminal 254b, then a short exists between double-sided comb structure 262 and comb structure 252b. The use of double-sided comb structure 262 therefore reduces by half the distance of required milling when searching for a specific defect by FIB milling as described above with reference to FIG. 7.

In one embodiment, the test procedure may begin with a continuity test for shorts, where both pass gates 268a and 268b are turned ON. In the case where an electrical short failure is detected, an additional partitioning test with separate usage of pass gates 268a and 268b may be performed to determine in which part of the comb the failure occurred.

Figure 9B:
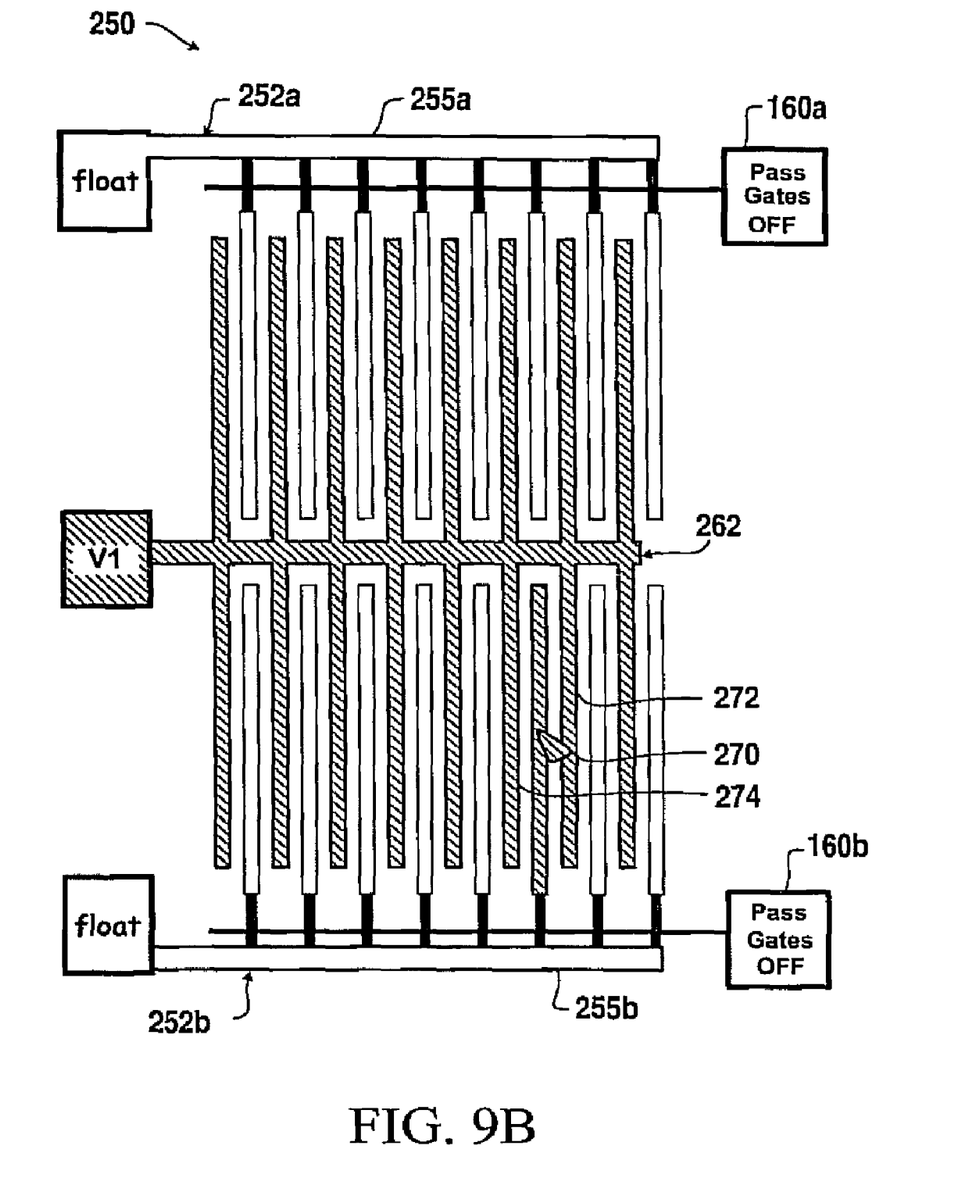

FIG. 9B is a schematic diagram of a voltage contrast image of test structure 250 wherein defect 270 shorts double-sided comb structure 262 to comb structure 252b. Pass gates 286a, 268b are turned OFF to electrically isolate fingers 266a, 266b from busbars 255a and 255b. In one example, pass gates 286a, 286b are turned OFF by grounding pass gate terminals 160a, 160b. Electrically conducting particle 270 conducts electricity between fingers 272 and 274 therefore placed them at the same voltage potential. When viewed using scanning electron microscope, the voltage contrast immediately shows finger 274 as being shorted to one of its neighbors, as represented in FIG. 9B with cross-hatching. Because of the nature of double-sided comb structure 262, only about half of the length of test structure 250 needs to be cross-sectioned by FIB milling to identify the cause of the short. Specifically, only the length of finger 274 needs to be checked. This is in contrast to test structure 150 described above with reference to FIGS. 4-7, in which nearly the entire length of the test structure may need to be checked.

Figure 10:
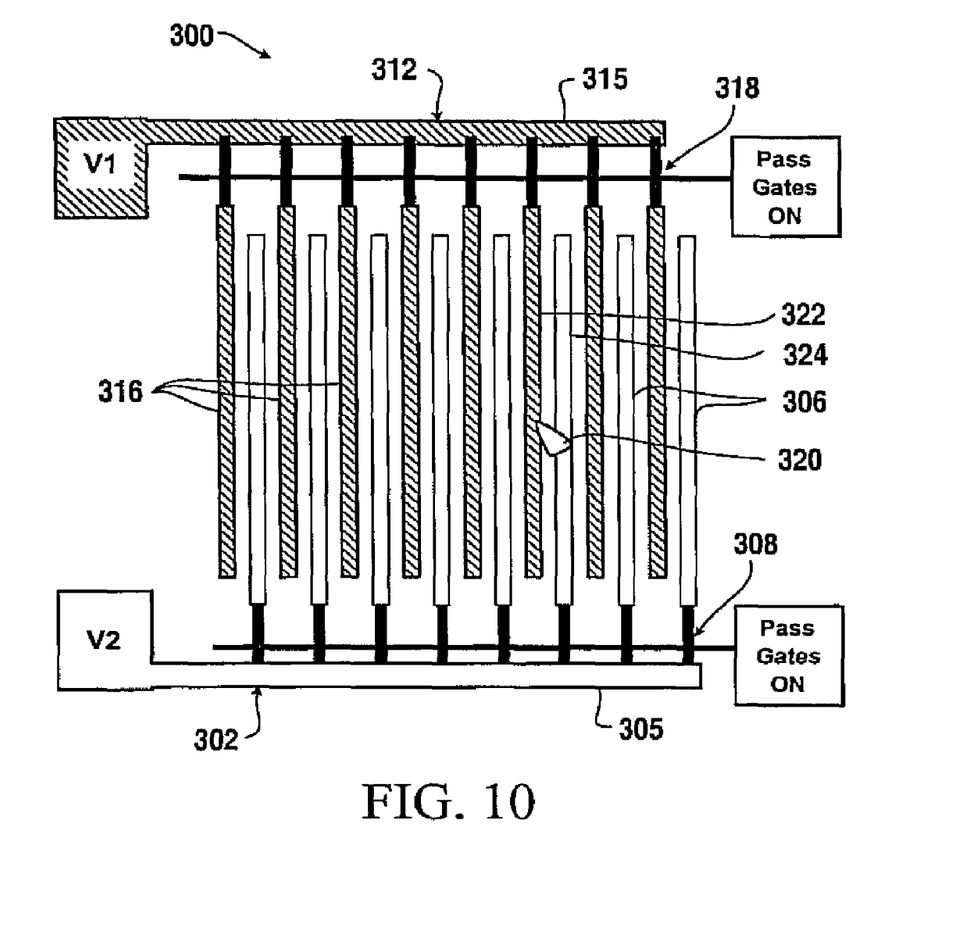
FIG. 10 shows a schematic diagram of another example of a test structure where both combs are built with the pass gates.

FIG. 10 shows a schematic diagram of a test structure 300. Test structure 300 has two comb-shaped structures 302, 312 each having a busbar 305, 315 connected to a plurality of fingers 306, 316 by way of a plurality of pass gates 308, 318, respectively. The use of pass gates 308, 318 on both comb structures allows the yield test engineer to localize a defect 320 as being between two fingers 322, 324, as opposed to being between finger isolated from its busbar and one of its two neighbors as described above with reference to FIG. 6. Specifically, a first voltage contrast test can be performed with busbar 305 disconnected from fingers 306 to identify which of fingers 306 the shorted to comb structure 312, and then a second voltage contrast test can be performed with busbar 315 disconnected from fingers 316 to determine which of fingers 316 the defect is adjacent. By performing the voltage contrast test twice in this way, the short can be localized to the space between two fingers: the one of fingers 306 identified in the first test and the one of fingers 316 identified in the second test.

Figure 11:
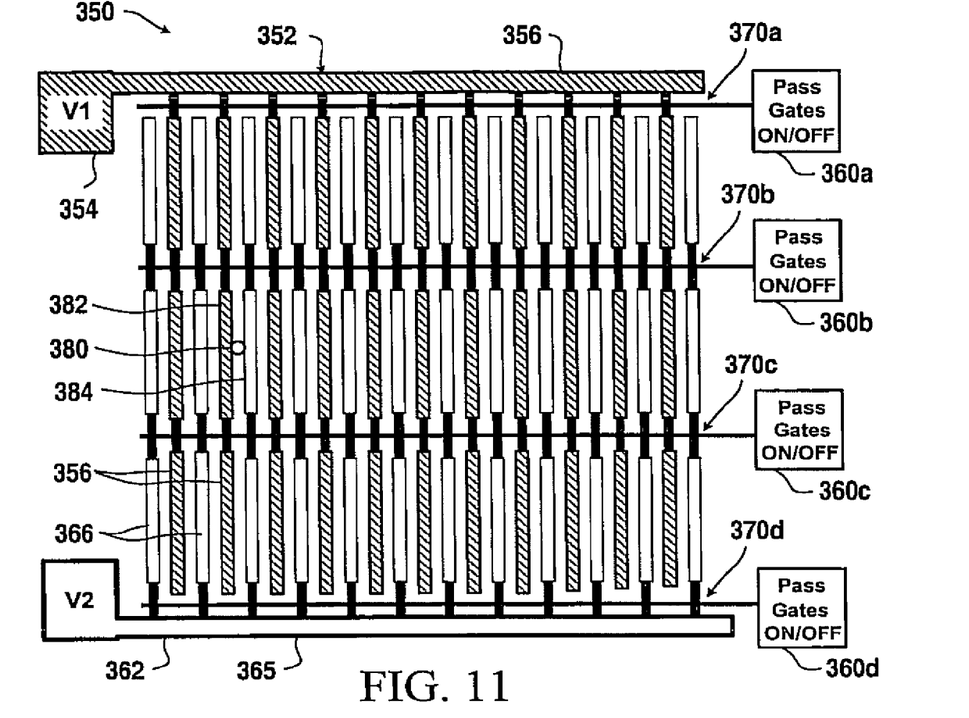
FIG. 11 shows another example of a test structure having two comb-shaped structures.

FIG. 11 shows test structure 350 having two comb-shaped structures 352, 362, each having a busbar 355, 365 connected to a plurality of fingers 356, 366 via a plurality of pass gates 370a-370d. Each finger 306, 316 is segmented into a plurality of finger segments by pass gates 370a-370d. Each set of pass gates 370a-370d is independently controlled by applying voltage to pass gate terminals 360a-36d. This allows localization of a defect causing a short to an area between two adjacent segments and two adjacent pass gates.

For instance, a defect 380 electrically connects segment 382 and segment 384. Turning all pass gates 370a, 370b, 370c, and 370d ON will show that a short exists by performing an electrical continuity test as described above with reference to FIG. 4. Then, voltage contrast can be used to localize the short by selectively turning on and off pass gates 370a-370d. Initially simply turning pass gates 370d OFF and performing the voltage contrast will cause finger segment 384 to receive current from adjacent finger 382 through particle 380 causing the short. However, since finger segment 382 is electrically connected through pass gates 370b and 370c to the segments before and after finger segment 382, the entire finger will also show the same voltage. By turning OFF pass gates 370c and 370d, finger segment 384 will show the same voltage Vi as applied to terminal 354. The segment below finger segment 384 will not show the same voltage because it is isolated from finger segment 384 by pass gates 370c, which are turned OFF. However, the segment above finger segment 384 is electrically connected to finger segment 384 by way of pass gates 360b which are turned ON. Therefore, it is clear that the particle is located somewhere between finger segment 384 and the segment above finger segment 384 and the neighboring segments. By repeating the voltage contrast test with pass gates 3701, 370c, and 370d turned OFF, the electrical short is isolated and therefore there will be no voltage contrast information to identify a short. This will confirm that the short is between finger segment 384 and one of its neighbors. The short can further be localized to determine whether the short is between the neighbor to the left or the neighbor to the right by repeating the initial voltage contrast test, but with pass gates 370a turned OFF and the remaining pass gates 370b-370d turned ON.

Figure 12:
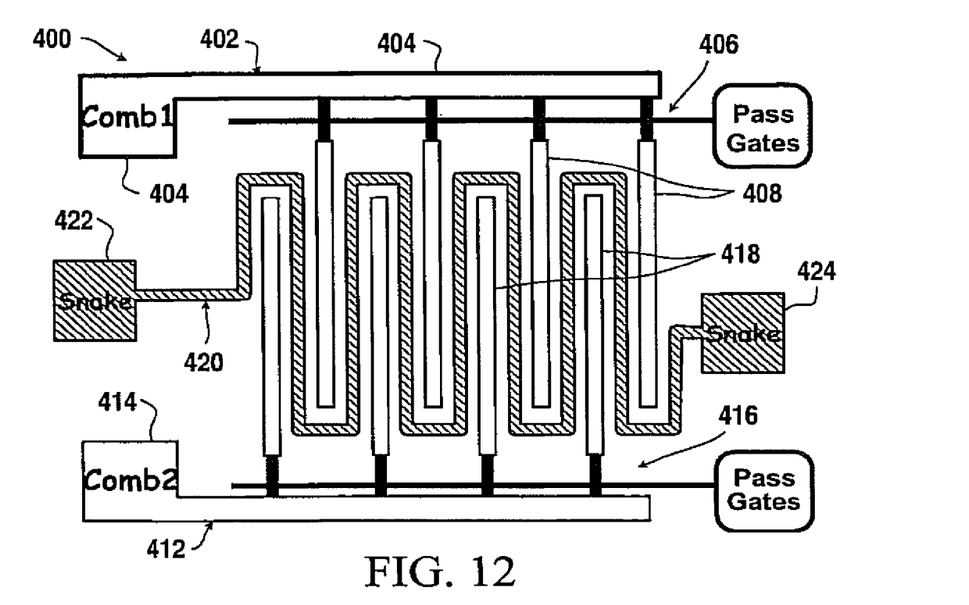
FIG. 12 shows an exemplary snake/comb test structure.

FIG. 12 shows an exemplary snake-comb test structure 400. Snake-comb structure 400 has a first comb structure 402 and a second comb structure 412, each having a corresponding terminal 404, 414. Each comb structure 402, 412 has a busbar 404, 414 connected by way of gates 406, 416 to a plurality of fingers 408, 418. In addition, a snake 420, formed as a serpentine conductor that weaves between interleaved fingers 408, 418 from a first snake terminal 422 to a second snake terminal 424. Snake 420 can be used to test for defects leading to an open circuit while fingers 408, 418 can be used along with snake 420, to find shorts in the manner described above or opens.

Specifically, an open circuit can be tested by testing snake 420 for continuity. If current flows from terminal 422 to terminal 424, then no open exists in snake 420. The fingers can also be tested for opens using voltage contrast analysis by turning ON pass gates 406, 416, applying voltage to terminals 404,414, and checking that all of the fingers "light up"—or show a constant brightness level—under an SEM.

The test for shorts can include applying a voltage Vito comb structures 402, 412 and a ground or other voltage V2 to one of snake terminals 422 or 424. If current flows, then a short exists between one of the fingers 408, 418 and the snake structure. If a short exists, it can be immediately narrowed to one of the two comb structures 402, 412 using a current sensor. Then, the pass gates for that comb structure can be turned OFF, and voltage applied to snake 420. Then, the finger that is adjacent to the defect will light up under SEM. Finally, if necessary, FIB analysis can be performed along the identified finger to identify the cause of the short.

As can be seen, because snake 420 weaves between fingers 408, 418 of comb structures 402, 412, it extends between adjacent fingers of each comb structure 402, 404. Therefore, for the purposes of testing for short circuits, snake 420 is electrically equivalent to the double-sided comb structure 262 in FIG. 9A.

It should be understood that the test structures shown here are by way of example only for purposes of illustration and do not represent the relative scale of an actual test structure. An actual test structure may be much larger with many more fingers than represented herein.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be Limited to the details given herein, but may be modified within the scope and equivalents of the appended claims.

The invention claimed is:

1. A test structure for localizing defects leading to shorts in an integrated circuit, the test structure comprising:
    a first pair of interleaved sets of fingers in a first region:
    a second pair of interleaved sets of fingers in a second region;
    a first busbar coupled to a first set of the first pair of interleaved sets of fingers and a first set of the second pair of interleaved sets of fingers;
    a second busbar in the first region, wherein the second busbar is coupled connected to a second set of the first pair of interleaved sets of fingers;
    a third busbar in the second region, wherein the third busbar is coupled to a second set of the second pair of interleaved sets of fingers;
    a first series of pass gates in the first region, wherein the first series of pass gates selectively coupling one set of the first pair of interleaved sets of fingers; and
    a second series of pass gates in the second region, wherein the second series of pass gates selectively coupling one set of the second pair of interleaved sets of fingers to one of the first and third busbars, respectively.

2. The test structure of claim 1, wherein each of the first series of pass gates comprise a transistor.

3. The test structure of claim 1, wherein:
    the first busbar, the first set of the first pair of interleaved sets of fingers, and the first set of the second pair of interleaved fingers form a double comb structure.

4. The test structure of claim 1, wherein the first series of pass gates is formed from a first plurality of transistors, wherein each of the first plurality of transistors comprise a gate electrode, and wherein the test structure further comprises:
    a pass gate terminal electrically connected to each gate electrode of the first plurality of transistors.

5. The test structure of claim 1, wherein:
    the second series of pass gates is formed from a second plurality of transistors, wherein each of the second plurality of transistors comprise a gate electrode, and wherein the test structure further comprising a second pass gate terminal, and wherein the second pass gate terminal is electrically coupled to each gate electrode of the second plurality of transistors.

6. The test structure of claim 1, wherein:
    the first busbar is directly electrically connected to each finger of the first set of the first pair of interleaved sets of fingers in the first region;
    the first busbar is directly electrically connected to each finger of the first set of fingers of the second pair of interleaved sets of fingers in the second region;
    the first series of pass gates is coupled between the second busbar and the second set of the first pair of interleaved sets of fingers; and
    the second series of pass gates is coupled between the third busbar and the second set of the second pair of interleaved sets of fingers.

* * * * *